(12) United States Patent
Suzuki et al.

(10) Patent No.: US 6,305,315 B1
(45) Date of Patent: Oct. 23, 2001

(54) ECR PLASMA APPARATUS

(75) Inventors: Masayasu Suzuki, Emsworth (GB); Satoko Ishii, Hatano (JP)

(73) Assignee: Shimadzu Corporation, Kyoto (JP)

( * ) Notice: Subject to any disclaimer, the term of this patent is extended or adjusted under 35 U.S.C. 154(b) by 0 days.

(21) Appl. No.: 09/534,168

(22) Filed: Mar. 24, 2000

(30) Foreign Application Priority Data

Mar. 25, 1999 (JP) ................................................. 11-082225

(51) Int. Cl.[7] .............................. C23C 16/00; H05H 1/00
(52) U.S. Cl. .............................. 118/723 MW; 156/345; 118/723 MA
(58) Field of Search ................... 118/723 MA, 723 MR, 118/723 ME, 723 MW, 723 I; 156/345

(56) References Cited

U.S. PATENT DOCUMENTS

| | | | |
|---|---|---|---|
| 4,401,054 | * 8/1983 | Matsuo et al. | 118/723 |
| 4,970,435 | * 11/1990 | Tanaka et al. | 315/111.21 |
| 5,869,149 | * 2/1999 | Denison et al. | 427/579 |
| 6,077,574 | * 6/2000 | Usami | 427/579 |
| 6,136,387 | * 10/2000 | Koizumi | 427/562 |

\* cited by examiner

*Primary Examiner*—Gregory Mills
*Assistant Examiner*—P. Hassanzadeh
(74) *Attorney, Agent, or Firm*—Kanesaka & Takeuchi

(57) ABSTRACT

An ECR plasma apparatus is formed of a vacuum chamber, a cavity disposed at a side surface of the vacuum chamber to which microwave is introduced, an electromagnetic coil disposed around the cavity, and a case member made of a conductive material having the same electric potential as that of the cavity. The case member is disposed in the vacuum chamber adjacent the cavity to supplement resonance operation in the cavity. Thus, the cavity and the electromagnetic coil disposed therearound can be miniaturized and lightened in weight.

6 Claims, 1 Drawing Sheet

ECR PLASMA APPARATUS

BACKGROUND OF THE INVENTION AND RELATED ART STATEMENT

The invention relates to an electron cyclotron resonance (hereinafter referred to as ECR) plasma apparatus, such as chemical vapor deposition (hereinafter referred to as CVD) apparatus, sputtering apparatus, etching apparatus and milling apparatus, using ECR.

Heretofore, an ECR plasma CVD apparatus, an ECR plasma sputtering apparatus or the like is structured such that a cavity is provided to a side surface of a vacuum chamber as an reaction chamber to use it as a cavity resonance chamber for generating ECR plasma, and plasma generated here is taken out into the vacuum chamber. For the cavity, a resonance with a $TE_{113}$ mode has been often set in consideration of a stable discharge at a discharge starting point. At this time, the cavity has a diameter of about 200 mm and a length of about 200 mm, and in order to provide a magnetic field in an ECR condition inside the cavity, an electromagnetic coil having an outer diameter of about 500 mm is disposed around the cavity.

However, the conventional ECR plasma apparatus has problems in miniaturizing its shape and reducing its weight. More specifically, as described above, to provide the magnetic field for the ECR condition inside the cavity, the electromagnetic coil having the outer diameter of about 500 mm is required, which results in a large size and a heavy weight of over 200 kg.

Therefore, the present invention has been made to solve the above problems, and an object of the invention is to provide an ECR plasma apparatus, wherein the size and weight of the electromagnetic coil can be reduced, so that the apparatus can be miniaturized and lightened in weight as a whole.

Further objects and advantages of the invention will be apparent from the following description of the invention.

SUMMARY OF THE INVENTION

To attain the above objects, an ECR plasma apparatus according to the present invention includes a vacuum chamber, a cavity which is disposed to a side surface of the vacuum chamber and into which microwave is introduced through a wave guide, an electromagnetic coil provided around the cavity, and a case member disposed on a vacuum chamber side of the cavity and made of a conductive material of the same electric potential as that of the cavity.

The cavity is provided with the case member made of the conductive material having the same electric potential as that of the cavity on the side of the vacuum chamber. The cavity and the conductive material case member put together operate as an equivalent cavity resonance chamber. Thus, even if the cavity itself is made small, the same effect as in a cavity of a large size can be equivalently obtained. When the cavity is made small, the electromagnetic coil for providing the magnetic field in the ECR condition in the cavity can be made small to thereby reduce its weight. As the result, the ECR plasma apparatus as a whole can be miniaturized and lightened in weight.

DETAILED DESCRIPTION OF PREFERRED EMBODIMENTS

Figure 1:
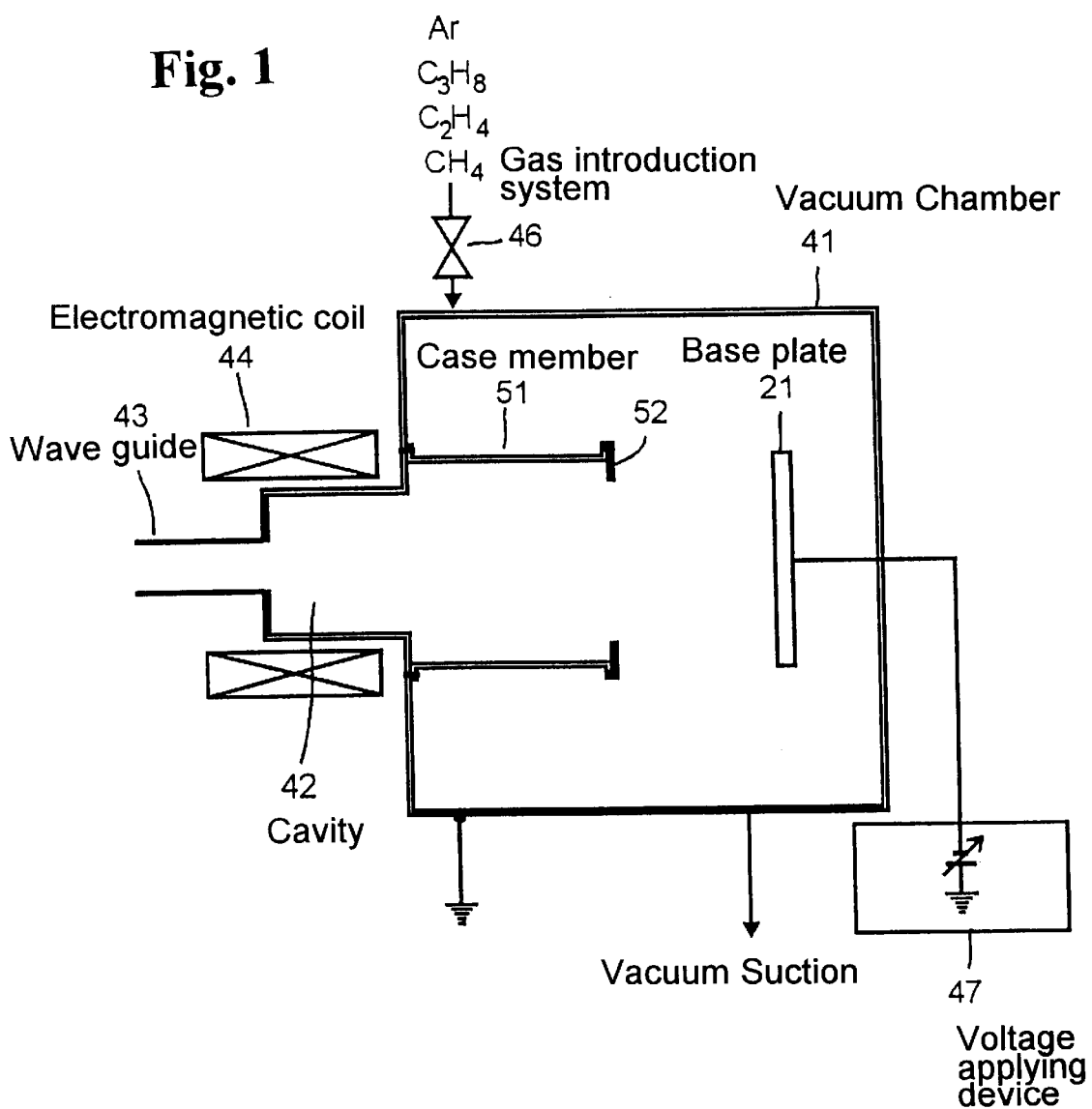
FIG. 1 is a block diagram showing an embodiment of the invention.

Embodiments of the invention are explained with reference to the accompanying drawing in detail. FIG. 1 shows an ECR plasma CVD apparatus to which the present invention is applied. In the drawing, a vacuum chamber 41 is a reaction chamber for carrying out CVD on a surface of a base plate or substrate 21 disposed therein, and air is evacuated until the vacuum chamber 41 comes to a predetermined pressure. Also, a reaction gas is introduced into the vacuum chamber 41 through a gas introduction system 46.

A cavity 42 is connected to a window disposed on a left side surface of the vacuum chamber 41, and provided with a wave guide 43 it 18 for introducing microwave to the cavity 42. The cavity 42 is provided with an electromagnetic coil 44 therearound to thereby generate ECR plasma in the cavity 42.

The cavity 42 is provided with a case member 51 formed of a cylindrical conductive material on a side of the vacuum chamber 41. A ring 52 made of an annular conductive material is attached to a forward edge of the cylindrical case member 51. The case member 51 and the ring 52 have the same electric potential as that of the cavity 42. The base plate 21 is disposed in the vacuum chamber 41 held by a base plate holder (not shown) and the like, and is applied with a negative voltage (D.C. voltage, or high frequency voltage superposed on D.C. voltage) by a voltage-applying device 47 or subjected to an earth float.

In the ECR plasma CVD apparatus, in case the CVD is carried out with respect to the base plate 21, microwave of about 2.45 GHz is introduced into the cavity 42 through the wave guide 43 and at the same time a magnetic field is formed by the electromagnetic coil 44, so that ECR is generated and active ECR plasma can be formed. The ECR plasma is taken out into the vacuum chamber 41 by a suitable magnetic field, such as mirror field or cusp magnetic field, formed in the vacuum chamber 41 by the electromagnetic coil 44.

On the other hand, a $C_nH_m$ gas (hydrocarbon gas), or a mixture of an inert gas and the $C_nH_m$ gas has been introduced in the vacuum chamber 41 through the gas introduction system 46, and the $C_nH_m$ gas is ionized by the ECR plasma, so that the vacuum chamber 41 is filled with carbon ions and hydrogen ions. The plasma-state carbon ions and hydrogen ions closely and firmly adhere to the surface of the base plate 21 having a negative electric potential to thereby form a carbon type protective film or layer. Thus, a DLC film, i.e. diamond-like film, excellent in corrosion resistance and abrasion resistance, can be formed.

Here, based on the ECR resonance condition of 2.45 GHz microwave, the cavity 42 can be formed with a diameter between 70 mm and 200 mm, preferably miniaturized to a diameter of less than 100 mm, and a length of less than 100 mm. Since the microwave is 2.45 GHz as mentioned above, the case member 51 can be made such that the diameter is between 70 mm and 100 mm, and the length is between 100 mm and 350 mm, preferably about 200 mm, which is determined based on the diameter of the cavity 42. A resonance action of the cavity 42 can be made up or supplemented by attaching thereto the case member 51 of the conductive material as described above, so that the plasma discharge can be started stably and maintained stably during the discharge. Therefore, the cavity 42 can be miniaturized as described above. Also, an outer diameter of the electromagnetic coil 44 can be miniaturized to about 200 mm and a weight thereof is reduced to about 50 kg.

Incidentally, the above explanation shows only an embodiment of the invention, and the invention is not limited to the ECR plasma CVD apparatus. It is a matter of course that the invention can also be applied to an ECR plasma apparatus, such as ECR plasma sputtering apparatus, ECR plasma etching apparatus and ECR plasma milling apparatus. Also, in the above embodiment, an example wherein the cavity 42 is attached to only one side surface of the vacuum chamber 41 is shown. However, in case cavities 42 are disposed on both side surfaces of the vacuum chamber 41 to carry out the CVD film formation on both sides of the base plate 21 at the same time, the two cavities 42 are similarly provided with the case members 51, respectively, and the two cavities and electromagnetic coils can also be miniaturized together.

As described hereinabove, according to the ECR plasma apparatus of the invention, the cavity functioning as an ECR cavity resonance chamber can be miniaturized, so that the electromagnetic coil disposed around the cavity can be miniaturized and lightened in weight, which results in miniaturization and lightening of the weight of the whole apparatus.

While the invention has been explained with reference to the specific embodiments of the invention, the explanation is illustrative and the invention is limited only by the appended claims.

What is claimed is:

1. An ECR plasma apparatus comprising:
   a vacuum chamber,
   a cavity disposed at a side of the vacuum chamber, microwave being introduced into said cavity,
   an electromagnetic coil disposed around the cavity, and
   a case member made of a conductive material having a same electric potential as that of the cavity and formed separately from a member for forming the cavity, said case member having a cylindrical shape and a diameter greater than a size of the cavity and being disposed in the vacuum chamber adjacent to the cavity to communicate therewith and spaced from an edge of the cavity to surround the cavity to supplement resonance operation in the cavity so that the cavity functioning as an ECR cavity resonance chamber can be miniaturized.

2. An ECR plasma apparatus according to claim 1, wherein said case member includes an annular ring at an end thereof projecting slightly inwardly of the case member.

3. An ECR plasma apparatus according to claim 2, further comprising a voltage applying device connected to a base plate disposed in the vacuum chamber, on which a film is formed.

4. An ECR plasma apparatus according to claim 3, further comprising a wave guide attached to the cavity to introduce the microwave to the cavity.

5. An ECR plasma apparatus according to claim 1, wherein said cavity and said case member put together form an equivalent cavity resonance chamber to form a small size cavity so that the small size cavity with the case member is made equal to, in the equivalent cavity resonance, a large size cavity without the case member.

6. An ECR plasma apparatus according to claim 5, wherein said case member is fixed to the vacuum chamber to form a step with respect to the cavity.

* * * * *